(12) United States Patent
McMahan et al.

(10) Patent No.: US 6,728,649 B2
(45) Date of Patent: Apr. 27, 2004

(54) METHOD AND APPARATUS FOR REMOVING DIGITAL GLITCHES

(75) Inventors: Dennis B. McMahan, Huntsville, AL (US); Jason N. Morgan, Madison, AL (US); Timothy D. Rochell, Elkmont, AL (US)

(73) Assignee: ADTRAN, Inc., Huntsville, AL (US)

( * ) Notice: Subject to any disclaimer, the term of this patent is extended or adjusted under 35 U.S.C. 154(b) by 232 days.

(21) Appl. No.: 10/061,848

(22) Filed: Feb. 1, 2002

(65) Prior Publication Data

US 2003/0146778 A1 Aug. 7, 2003

(51) Int. Cl.⁷ .................................................. H03B 1/00
(52) U.S. Cl. .......................................... 702/79; 702/191
(58) Field of Search .......................... 375/254; 713/400, 713/401; 327/18, 261, 552, 263, 265, 551–553; 702/79, 189–191

(56) References Cited

U.S. PATENT DOCUMENTS

| 4,305,041 | A |   | 12/1981 | Frerking |         |
|-----------|---|---|---------|----------|---------|
| 4,525,635 | A |   | 6/1985  | Gillberg |         |
| 4,868,430 | A |   | 9/1989  | Stewart  |         |
| 4,965,474 | A |   | 10/1990 | Childers et al. | |
| 4,965,524 | A |   | 10/1990 | Patchen  |         |
| RE33,461  | E |   | 11/1990 | Splett et al. |    |
| 5,155,380 | A |   | 10/1992 | Hwang et al. |     |
| 5,184,032 | A |   | 2/1993  | Leach    |         |
| 5,289,060 | A | * | 2/1994  | Elnashar et al. | 327/552 |
| 5,357,146 | A |   | 10/1994 | Heimann  |         |
| 5,495,205 | A |   | 2/1996  | Parker et al. |    |
| 5,604,452 | A |   | 2/1997  | Huang    |         |
| 5,815,690 | A | * | 9/1998  | Kowert et al. | 702/190 |
| 5,880,898 | A |   | 3/1999  | Park     |         |
| 6,021,168 | A |   | 2/2000  | Huh      |         |
| 6,055,587 | A |   | 4/2000  | Asami et al. |     |
| 6,122,336 | A |   | 9/2000  | Anderson |         |
| 6,192,091 | B1|   | 2/2001  | Yamada   |         |
| 6,535,057 | B2| * | 3/2003  | Chakravarthy | 326/28 |

FOREIGN PATENT DOCUMENTS

| JP | 61121532 | 6/1986 |
| JP | 61205023 | 9/1986 |
| JP | 5029892  | 2/1993 |
| JP | 10041794 | 2/1998 |
| JP | 11195987 | 7/1999 |

* cited by examiner

Primary Examiner—Marc S. Hoff
Assistant Examiner—Craig Steven Miller
(74) Attorney, Agent, or Firm—Thomas, Kayden, Horstemeyer & Risley, L.L.P.

(57) ABSTRACT

A method and apparatus for removing glitches, interference or noise from a clock signal are provided by the present invention. In accordance with the invention, a glitch-ridden clock signal is monitored to determine when a transition in the glitch ridden clock signal occurs. When a transition occurs, a counter is initiated in accordance with a second high-speed clock signal. The value of this counter is compared to a compare value. The compare value is selected to approximately equal the expected period of the glitch-ridden clock signal. If the counter value equals the compare value, it is assumed that the transition was a valid transition and the transition is carried through and output as a glitch-free clock signal. However, if a transition occurs before the count value equals the counter compare value, it is assumed that the transition is invalid and no transition is carried to the glitch-free clock output. Thus, the present invention removes glitches from a received clock signal and outputs a glitch-free clock signal.

20 Claims, 2 Drawing Sheets

METHOD AND APPARATUS FOR REMOVING DIGITAL GLITCHES

FIELD OF THE INVENTION

The present invention relates in general to an improvement for digital electronic circuits. More particularly, the present invention relates to a new and improved apparatus and method for removing glitches from a clock signal used to time the operations of a digital circuit.

BACKGROUND OF THE INVENTION

In digital communications, it is often necessary to time the operations of the digital communication circuits with a clock signal. In particular, clock signals are used to synchronize the transfer of digital information between various locations. These clock signals can be derived in a number of different ways. In the simplest case, there exists a source such as a crystal, oscillator, etc. that produces the clock signal and is referred to as a clock. The clock generates a sequence of clock pulses that are normally equally spaced and of equal duration. These sequences of pulses are used to time and control the digital circuitry that makes up a communications device.

The pulse width of the clock pulses utilized by digital circuits is typically selected to be as small as possible while remaining consistent with the operating characteristics of the digital circuit. The period of the clock pulses is selected according to the speed at which the digital circuit must operate. The major restriction is that the clock period minus the pulse width must be large enough to allow the digital circuit to shift to its new state before the next clock pulse occurs. If this restriction is not met, the digital circuit will not have a sufficient amount of time to change states correctly.

In any electronic system, noise, interference and electrostatic discharges (ESD) can create additives to electric signals in the system. These additives are often referred to as glitches and may affect any portion of an electronic circuit. Thus, it is possible that these additives or glitches may affect the clock signal in the system. Consequently, the clock signal may not meet the clock period minus pulse width restriction discussed above. Because digital circuits rely heavily upon a consistent clock pulse to time their state transitions and operations, a glitch in the clock of digital circuit may disable the functioning of the electronic circuit entirely.

Digital designers have used analog filters composed of resistors and capacitors to attempt to filter the clock signal and remove glitches that may occur. However, these prior art analog filters are deficient in a number of respects. In particular, analog filters can only remove clock glitches of a certain width for which they must be designed. Therefore, what is needed is an improved method and apparatus for removing glitches that allows glitches of any width to be removed.

SUMMARY OF THE INVENTION

A preferred embodiment of the present invention provides an apparatus for removing glitches from a first clock signal produced by a first clock. The apparatus includes a high-speed clock that produces a second clock signal. The first clock signal and the second clock signal are preferably synchronous and the second clock signal has a frequency that is greater than the first clock signal. More particularly, the high-speed clock has a period that is less than either the normal high or low time of the first clock signal. A counter maintains a count in accordance with the second clock signal. A first comparator compares the count kept by the counter to a compare value. The compare value is a binary number that is N bits in width and the second clock signal has a period T such that the maximum duration of a glitch that can be removed by the apparatus is given by the equation $2^N*T$. Preferably, the compare value may be manually or automatically adjusted. The count is reset if the count is equal to the compare value. A second comparator determines if a first value of the first clock signal is equal to a second value of the first clock signal and resets the counter if the first value is not equal to the second value. A first memory stores a first value of the first clock signal and replaces the first value of the first clock signal with a second value of the first clock signal if the first value is not equal to the second value. A second memory receives the stored value from the first memory and outputs the stored value as a valid transition in the first clock signal when the first comparator determines that the count is equal to the compare value. The first memory and the second memory are preferably D flip-flops that are driven by the high-speed clock.

Glitches in electronic circuits due to noise or interference are undesirable in that they may cause the circuit to malfunction, lock up or produce inaccurate and unpredictable results. This is especially true when the glitch occurs in a clock signal that is being used to synchronize the functioning of the electronic circuit. The above described apparatus provides a new and useful way to remove glitches from a clock signal. Furthermore, the apparatus can be constructed from relatively simple and inexpensive electronics and adapted for use in a wide variety of environments. Thus, the present invention is a substantial improvement upon the prior art.

In a selected embodiment, the present invention further encompasses a method of removing glitches in a clock signal caused by noise or interference. The method begins with the receiving of the clock signal. The clock signal is monitored by sampling the clock signal in accordance with a second clock signal and comparing consecutive samples of the clock signal to determine if a transition in the clock signal has occurred. A count is initiated in accordance with the second clock signal, which has a period that is less than the clock signal, when a first transition in the clock signal is detected. The first transition is output as a valid transition in the clock signal if the count reaches a predetermined number. The count is reset if a second transition is detected prior to the count equaling the predetermined number. The count is also reset when the count reaches the predetermined number. The predetermined number may be manually or automatically altered.

In yet another method performed in accordance with the present invention, glitches are detected in a first clock signal by detecting a time period between transitions in the first clock signal. The detected time period is then compared with an expected time period to determine if the transition in the first clock signal was valid. The expected time period is preferably equal to an expected period of the first clock signal. A glitch-free clock signal is output every time a valid transition in said first clock signal occurs.

By comparing the time between transitions in a clock signal with an expected time period for the clock signal, the above described method is able to distinguish between valid and invalid transitions in the clock signal. A glitch-free clock signal can then be output every time a valid transition is detected. In this manner, glitches are effectively removed from the clock signals and the deleterious effects of the glitches can be avoided. Therefore, in its various embodiments, the present invention is an improvement upon the prior art.

BRIEF DESCRIPTION OF THE DRAWINGS

Further advantages of the invention will become apparent by reference to the detailed description of preferred embodiments when considered in conjunction with the drawings, which are not to scale, wherein like reference characters designate like or similar elements throughout the several drawings as follows.

DETAILED DESCRIPTION OF THE INVENTION

As briefly discussed above, additives or glitches may result from a variety of phenomena such as noise, interference or ESD. These glitches may corrupt or alter the electric signals utilized by digital circuits. Because a clock signal is typically used to time the operation of a circuit, glitches in the clock signal can have particularly devastating effect on a digital circuit's functioning. Therefore, the present inventors have developed a method and apparatus for removing these glitches from a clock signal.

Figure 1:
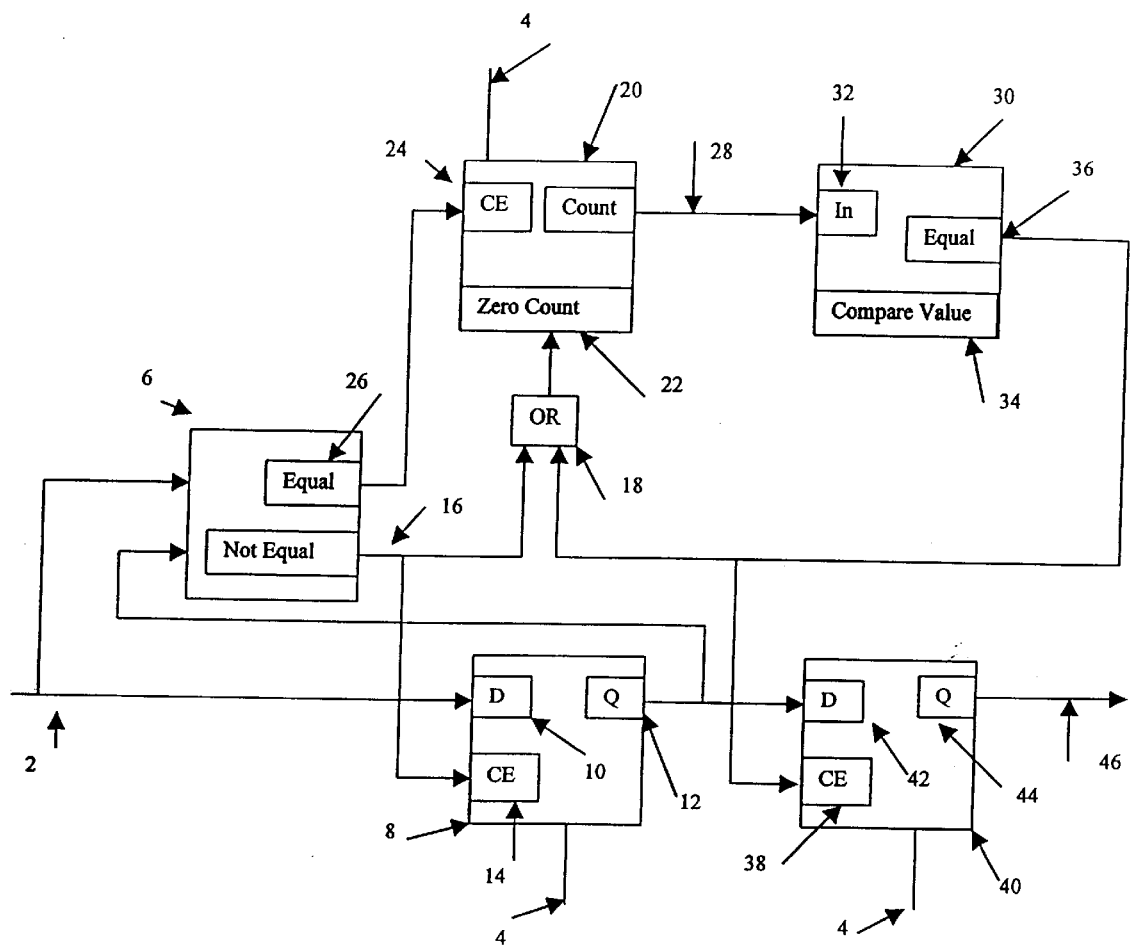
FIG. 1 is a circuit diagram of a glitch removal circuit constructed in accordance with a preferred embodiment of the present invention.

FIG. 1 illustrates a preferred embodiment of the present invention from removing glitches from a clock signal. As shown in FIG. 1, the circuit has two inputs, a glitch-ridden clock signal 2 and a high-speed clock signal 4. The clock signals can be derived in a number of different ways. In the simplest case, the clocks are derived from a clock source such as a crystal or oscillator that generates a sequence of clock pulses that are preferably equally spaced and of equal duration. Preferably, the glitch-ridden clock signal 2 and the high-speed clock signal 4 are generated such that they are synchronous. The frequency of the high speed clock should always be greater than the frequency of the glitch ridden clock. The higher the difference in frequency, the more bits needed for the counter. It should also be noted that it is preferable for the frequency of the high speed clock to be an order of magnitude greater than the glitch ridden clock; however, it does not have to be. The glitch-ridden clock signal 2 is provided to one input of a first comparator 6 and the D-input of a first delay (D) flip-flop 8. The D flip-flop 8 is a positive edge triggered memory device that transfers its input 10 to its output 12 in accordance with a positive edge of a high-speed clock signal 4 when its chip-enable input 14 is high. Thus, the output 12 of the first D flip-flop 8 is the value of the glitch-ridden clock signal 2 during the previous clock pulse of the high-speed clock signal 4 when the chip enable (CE) 14 of the first D flip-flop 8 is high. The output 12 of the first D flip-flop 8 is electrically connected to the second input of the first comparator 6. Thus, the first comparator 6 compares the current glitch-ridden clock signal value 2 with a previously stored glitch-ridden clock signal value 12. If these values are not equal, the first D flip-flop 8 is enabled by the not equal output 16 of the first comparator 6 to transfer its input 10 to its output 12.

The not equal output 16 of the first comparator 6 is also provided to an OR-gate 18. The output of the OR-gate 18 is connected to a zero count input 22 of a counter 20 such that a count kept by the counter 20 is reset when the not equal output 16 of the first comparator 6 goes high and turns on the OR-gate 18. The counter 20 is preferably triggered by the positive edge of the high-speed clock signal 4. The counter's chip enable input 24 is electrically connected to the equal output 26 of the first comparator 6. As previously stated, the counter 20 is driven by the high-speed clock signal 4. Thus, the counter 20 effectively counts the number of high-speed clock 4 cycles since the last detected transition in the glitch-ridden clock signal 4. The output of the counter is an N bit wide binary number where N is a predetermined integer whose value is selected as discussed below.

The count value 28 from the counter 20 is fed put into a first input 32 of a second comparator 30. The second input 34 to the second comparator 20 is preferably an N-bit wide programmable compare value. However, for particular applications, it will be readily appreciated that the compare value could be a predetermined value that is stored in ROM or hard wired into the circuitry of the glitch removal circuit. The second comparator 30 compares the count 28 from the counter 20 to the programmable compare value 34. If the count 28 and the compare value 34 are equal, the second comparator 30 raises its equal output 36 to a high state. The equal output 36 is fed back to the OR-gate 18 that also receives the not equal output 16 from the first comparator 26 where it is used to reset the counter 20.

The equal output 36 of the second comparator 30 is also provided to the chip enable input 38 of a second D flip-flop 40. The input 42 of the second D flip-flop 40 is electrically connected to the output 12 of the first D flip-flop 8. Thus, when the chip enable 38 of the second D flip-flop 40 goes high, the second D flip-flop 40 transfers the output 12 of the first D flip-flop to the output 44 of the second D flip-flop 40. This output 44 is the desired glitch-free clock signal 46.

The programmable compare value is selected to remove glitches that last up to a predetermined duration. The criteria for determining the width of the glitch that can be removed from the glitch-ridden clock signal are as follows. Let T represent the period of the high-speed clock and N equal the bit width of the counter. Given these parameters, the range of sizes of glitches that can be removed by the circuit of FIG. 1 can be expressed as T to $2^N*T$. Thus, if the high-speed clock has a period of 0.00001 seconds and the counter has a bit width of 5, the glitch removal circuit can remove glitches that are 0.00032 seconds in duration. Since both T and N can be selected to fit the desired application, the size of the glitches that can be removed in accordance with selected embodiments of the present invention is effectively unlimited. However, it should be noted that if the period of the high-speed clock, T, is greater than the normal high and low times of the glitch-ridden clock, the glitch removal circuit of FIG. 1 will remove normal clock pulses.

To better understand the functioning of the glitch removal circuit depicted in FIG. 1, it is useful to consider the two possible situations; (1) the Glitch-ridden clock does not contain a glitch; and (2) the glitch-ridden clock does contain a glitch. If the glitch-ridden clock signal 2 does not have a glitch, the transition in the glitch-ridden clock signal is valid and the counter value will reach the programmable compare value. In this case, the second D flip-flop 40 is enabled such that the valid transition in the glitch-ridden clock signal 2 is transferred to the glitch-free clock signal output 46 and the counter 20 is reset. Alternatively, if the transition in the glitch-ridden clock signal represents a glitch in the glitch-ridden clock signal 2, the count value 28 never equals the programmable compare value. Consequently, the second comparator 30 will not enable the second D flip-flop 40 to transfer the last transition to the glitch-free clock output 46.

The comparators, D flip-flops and counter are depicted as separate devices in FIG. 1. However, the present invention may also be embodied in a single gate array to further reduce its cost and complexity. In such an embodiment, the glitch removing circuit would have three inputs: a clock signal from which glitches are to be removed, a high-speed clock signal having a frequency that is greater than the clock signal from which the glitches are to be removed and a programmable counter compare value. The sole output of the circuit is a newly generated glitch free clock signal. The glitch removing circuit effectively looks for transitions in the clock signal. For example, the process would start if the clock transitioned from 0 to 1 or 1 to 0. Either of these transitions may be a glitch or a true clock transition. The circuit decides whether to remove this transition based upon the time that elapses between transitions. The elapsed time is measured using the counter that runs off of the high-speed clock that is started after every transition. The counter value is compared against an inputted compare value on every 0 to 1 high-speed clock transition. If the counter value equals the compare value, a clock transition is created on the output clock. If the counter value is less than the compare value, the transition was a glitch and is not propagated to the output clock.

Figure 2:
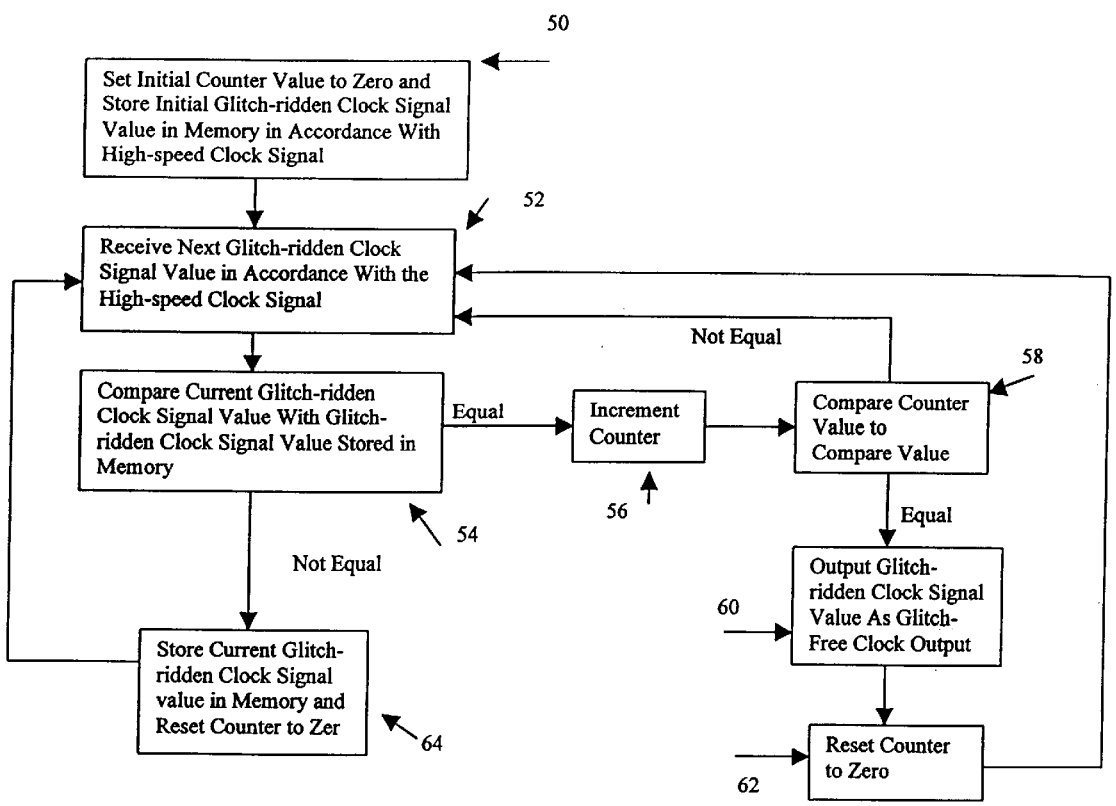
FIG. 2 is a flow chart of a preferred method of removing glitches from a clock signal in accordance with the present invention.

A preferred method in accordance with the present invention is set forth in FIG. 2. The method commences with the setting of a counter value to zero and the reception of an initial glitch-ridden clock signal value in accordance with a high-speed clock signal as set forth in block 50. This initial glitch-ridden clock signal value is stored in memory. Next, as shown in block 52, a current glitch-ridden clock signal is received in accordance with the high-speed clock. In block 54, the current value of the glitch-ridden clock signal is then compared to the value of the glitch ridden clock signal that was previously stored in memory. If the two glitch-ridden clock values are equal, the method advances to block 56 wherein the counter value is incremented. The method then proceeds to block 58 where the value of the counter is compared to a predetermined compare value. If the count value equals the predetermined compare value, the transition in the glitch-ridden clock signal is valid and the method proceeds to block 60 wherein the glitch-ridden clock value is output as a glitch-free clock signal. The count is also reset as set forth in block 62 and the method proceeds back to block 50 wherein the clock value of the glitch-ridden clock is received in accordance with the high-speed clock signal. If the count value is not equal to the predetermined compare value in block 58, the method then proceeds back to block 52 wherein the glitch-ridden clock is again sampled in accordance with the high-speed clock. If the two glitch-ridden clock values compared in step 54 are not equal, the method proceeds to block 64 wherein the counter is reset to zero and the new glitch-ridden clock value is stored in memory. The method then proceeds back to block 52 wherein the current glitch-ridden clock signal is sampled in accordance with the high-speed clock.

While we have shown and described several preferred embodiments in accordance with the present invention, it is expressly understood that the present invention is not limited to the particular embodiments described herein, but is susceptible to numerous modifications as recognized by one skilled in the art. Therefore, the true scope of the present inventors' invention is as set forth in the following claims.

We claim:

1. An apparatus for removing glitches from a first clock signal produced by a first clock, said apparatus comprising:
a high-speed clock for producing a second clock signal wherein said second clock signal has a frequency that is greater than said first clock signal;
a counter for maintaining a count in accordance with said second clock signal;
a first comparator for comparing said count kept by said counter to a compare value and resetting said count if said count is equal to said compare value;
a second comparator for determining if a first value of said first clock signal is equal to a second value of said first clock signal and resetting said counter if said first value is not equal to said second value;
a first memory for storing a first value of said first clock signal and replacing said first value of said first clock signal with a second value of said first clock signal if said first value is not equal to said second value; and
a second memory for receiving said stored value from said first memory and outputting said stored value as a valid transition in said first clock signal when said first comparator determines that said count is equal to said compare value.

2. The apparatus of claim 1 wherein said compare value may be manually or automatically adjusted.

3. The apparatus of claim 1 wherein said compare value is a binary number that is N bits in width and wherein said second clock signal has a period T such that the maximum duration of a glitch that can be removed by said apparatus is given by the equation $2^{N}*T$.

4. The apparatus of claim 1 wherein said first memory and said second memory further comprise D flip-flops and said D flip-flops are driven by said high-speed clock.

5. The apparatus of claim 1 wherein said high-speed clock has a period that is less than either a normal high or low time of said first clock signal.

6. A method of removing glitches in a clock signal caused by noise or interference, said method comprising the steps of:
receiving said clock signal;
monitoring said clock signal to determine if a transition has occurred in said clock signal;
initiating a count when a first transition in said clock signal is detected;
outputting said first transition as a valid transition in said clock signal if said count reaches a predetermined number; and
resetting said count if a second transition is detected prior to said count equaling said predetermined number.

7. The method of claim 6 further comprising manually or automatically altering said predetermined number.

8. The method of claim 6 wherein said step of monitoring said clock signal further comprises sampling said clock signal in accordance with a second clock signal and comparing consecutive samples of said clock signal to determine if a transition in said clock signal has occurred.

9. The method of claim 8 wherein said step of initiating a count further comprises starting a count in accordance with said second clock signal wherein said second clock signal has a period that is less than said clock signal.

10. The method of claim 6 further comprising resetting said count when said count reaches said predetermined number.

11. A method of detecting glitches in a first clock signal said method comprising:
detecting a time period between transitions in said first clock signal; and
comparing said detected time period with an expected time period to determine if said transition in said first clock signal is valid.

12. The method of claim 11 wherein said step of detecting a time period between transitions in said first clock signal further comprises sampling said first clock signal in accordance with a second clock signal and comparing consecutive samples to determine if a transition has occurred in said first clock signal.

13. The method of claim 11 further comprising outputting a glitch-free clock signal such that a transition in said glitch-free clock signal is output every time a valid transition in said first clock signal occurs.

14. The method of claim 11 further comprising selectively altering said expected time period.

15. The method of claim 11 wherein said expected time period is equal to an expected period of said first clock signal.

16. An apparatus for removing glitches from a first clock signal and outputting a glitch-free clock signal, said apparatus comprising:

a counter for maintaining a count;

a first comparator for receiving and sampling said first clock signal and comparing a current value of said first clock signal with said a previous value of said first clock signal wherein said first comparator resets said count of said counter if said current value of said first clock signal does not equal said previous value of said first clock signal; and a second comparator for comparing said count to a count compare value and outputting a transition in a glitch-free clock output if said count equals said count compare value and resetting said count when said count equals said count compare value.

17. The apparatus of claim 16 further comprising a high-speed clock wherein said counter maintains said count in accordance with said high-speed clock.

18. The apparatus of claim 17 wherein said first clock signal and said high-speed clock are synchronous.

19. The apparatus of claim 16 further comprising a flip-flop for outputting said glitch-free clock signal under control of said second comparator.

20. The apparatus of claim 16 further comprising an OR-gate for resetting said counter if said current value does not equal said previous value or said count equals said count compare value.

* * * * *